United States Patent
Ohashi et al.

(10) Patent No.: US 8,672,455 B2
(45) Date of Patent: Mar. 18, 2014

(54) PIEZOELECTRIC ELEMENT, PIEZOELECTRIC ACTUATOR, DROPLET-EJECTING HEAD, DROPLET-EJECTING APPARATUS, AND METHOD FOR MANUFACTURING PIEZOELECTRIC ELEMENT

(75) Inventors: Koji Ohashi, Matsumoto (JP); Masao Nakayama, Shiojiri (JP); Noboru Furuya, Chino (JP)

(73) Assignee: Seiko Epson Corporation, Tokyo (JP)

(*) Notice: Subject to any disclaimer, the term of this patent is extended or adjusted under 35 U.S.C. 154(b) by 225 days.

(21) Appl. No.: 13/048,175

(22) Filed: Mar. 15, 2011

(65) Prior Publication Data
US 2011/0228013 A1   Sep. 22, 2011

(30) Foreign Application Priority Data
Mar. 16, 2010   (JP) .................................. 2010-059120

(51) Int. Cl.
*B41J 2/045* (2006.01)

(52) U.S. Cl.
USPC .......................................................... 347/68

(58) Field of Classification Search
None
See application file for complete search history.

(56) References Cited

U.S. PATENT DOCUMENTS

| | | | |
|---|---|---|---|
| 6,336,717 B1 | 1/2002 | Shimada et al. | |
| 2005/0052506 A1* | 3/2005 | Yagi et al. | 347/72 |
| 2006/0203041 A1 | 9/2006 | Shimada et al. | |
| 2006/0209137 A1* | 9/2006 | Kojima et al. | 347/68 |
| 2009/0021119 A1* | 1/2009 | Yasumi et al. | 310/370 |
| 2011/0043573 A1* | 2/2011 | Umeda | 347/68 |

FOREIGN PATENT DOCUMENTS

JP   2000-326503   11/2000

* cited by examiner

*Primary Examiner* — Matthew Luu
*Assistant Examiner* — Erica Lin
(74) *Attorney, Agent, or Firm* — Workman Nydegger

(57) ABSTRACT

A piezoelectric element includes a first electrode disposed on a substrate, a piezoelectric layer disposed on the first electrode, a second electrode disposed on the piezoelectric layer, and a resin layer that covers at least the side surfaces of the first electrode. The first electrode includes a metal layer and an anti-oxidation layer. The metal layer is formed of a base metal. The anti-oxidation layer is disposed between the metal layer and the piezoelectric layer to prevent contact between the metal layer and the piezoelectric layer.

9 Claims, 9 Drawing Sheets

PIEZOELECTRIC ELEMENT, PIEZOELECTRIC ACTUATOR, DROPLET-EJECTING HEAD, DROPLET-EJECTING APPARATUS, AND METHOD FOR MANUFACTURING PIEZOELECTRIC ELEMENT

This application claims a priority to Japanese Patent Application No. 2010-059120 filed on Mar. 16, 2010 which is hereby expressly incorporated by reference herein in its entirety.

BACKGROUND

1. Technical Field

The present invention relates to a piezoelectric element, a piezoelectric actuator, a droplet-ejecting head, a droplet-ejecting apparatus, and a method for manufacturing a piezoelectric element.

2. Related Art

It is known that piezoelectric actuators or ink jet recording heads can be manufactured by thin-film technology to reduce the thickness of a piezoelectric element, allowing high-speed driving. For example, Japanese Unexamined Patent Application Publication No. 2000-326503 discloses an ink jet recording head that can be manufactured by thin-film technology.

In the ink jet recording head according to Japanese Unexamined Patent Application Publication No. 2000-326503, the top surface and the side surfaces of a lower electrode of a piezoelectric element are covered with a piezoelectric layer. Because the lower electrode is exposed to an oxidizing atmosphere in the formation of the piezoelectric layer, the lower electrode is formed of a noble metal, such as platinum, which is more resistant to oxidation than base metals.

Use of a lower electrode formed of an easily oxidizable base metal material may result in the oxidation of the lower electrode in the formation of the piezoelectric layer, causing an increase in the volume of the lower electrode. This expansion may result in the detachment of the lower electrode or the occurrence of cracks. Thus, the lower electrode has a low degree of freedom with respect to the selection of the electrode material.

SUMMARY

An advantage of some aspects of the invention is that it provides a piezoelectric element that can have a high degree of freedom with respect to the selection of the electrode material, a method for manufacturing the piezoelectric element, and a piezoelectric actuator, a droplet-ejecting head, and a droplet-ejecting apparatus, each including the piezoelectric element.

(1) A piezoelectric element according to one aspect of the invention includes:
  a first electrode disposed on a substrate;
  a piezoelectric layer disposed on the first electrode;
  a second electrode disposed on the piezoelectric layer; and
  a resin layer that covers at least the side surfaces of the first electrode,
  wherein the first electrode includes a metal layer and an anti-oxidation layer, the metal layer being formed of a base metal, and
  the anti-oxidation layer is disposed between the metal layer and the piezoelectric layer to prevent contact between the metal layer and the piezoelectric layer.

The term "on" as in "a second specific thing (hereinafter referred to as "B") is formed on a first specific thing (hereinafter referred to as "A")", as used herein, refers to both the case where B is directly formed on A and the case where B is formed on A with a third thing interposed therebetween. Likewise, the term "under", as used herein, refers to both the case where B is directly formed under A and the case where B is formed under A with a third thing interposed therebetween.

In accordance with one aspect of the invention, the metal layer of the first electrode is protected from oxidation by the formation of the anti-oxidation layer between the metal layer of the first electrode and the piezoelectric layer to prevent contact between the metal layer and the piezoelectric layer and the formation of the resin layer to cover the side surfaces of the first electrode. This increases the degree of freedom with respect to the selection of the material for the metal layer of the first electrode and allows the use of a base metal.

(2) In a piezoelectric element according to one aspect of the invention, the material of the metal layer may contain at least one selected from the group consisting of W, Ta, Hf, Mo, Nb, Zr, Cu, Ni, Co, Fe, Cr, V, and Ti.

In accordance with one aspect of the invention, the metal layer of the first electrode is protected from oxidation by the formation of the anti-oxidation layer between the metal layer of the first electrode and the piezoelectric layer to prevent contact between the metal layer and the piezoelectric layer and the formation of the resin layer to cover the side surfaces of the first electrode. Thus, a base metal can also be used as the material of the metal layer of the first electrode.

(3) In a piezoelectric element according to one aspect of the invention, the first electrode may further include an orientation control layer between the piezoelectric layer and the anti-oxidation layer.

The orientation control layer can control the orientation of the piezoelectric layer.

(4) In a piezoelectric element according to one aspect of the invention, the first electrode may further include a first adhesion layer between the metal layer and the orientation control layer.

The first adhesion layer can improve the reliability of the first electrode.

(5) A piezoelectric actuator according to one aspect of the invention includes a piezoelectric element according to any one of (1) to (4), wherein the substrate is a diaphragm.

The invention can provide a piezoelectric actuator including a piezoelectric element according to one aspect of the invention.

(6) A piezoelectric actuator according to one aspect of the invention may include a second adhesion layer between the first electrode and the diaphragm.

The second adhesion layer can improve the adhesion between the first electrode and the diaphragm.

(7) A droplet-ejecting head according to one aspect of the invention includes a piezoelectric actuator according to (5) or (6).

The invention can provide a droplet-ejecting head including a piezoelectric actuator according to one aspect of the invention.

(8) A droplet-ejecting apparatus according to one aspect of the invention includes the droplet-ejecting head according to (7).

(9) A method for manufacturing a piezoelectric element according to one aspect of the invention includes
  forming a first electroconductive film on a substrate;
  forming a piezoelectric material film on the first electroconductive film;
  heat-treating the piezoelectric material film to form a piezoelectric film;

patterning the first electroconductive film and the piezoelectric film to form a first electrode and a piezoelectric layer;

forming a resin layer to cover at least the side surfaces of the first electrode; and forming a second electrode on the piezoelectric layer, wherein the forming of a first electroconductive film involves forming a metal film formed of a base metal and forming an anti-oxidation film between the metal film and the piezoelectric material film to prevent contact between the metal film and the piezoelectric material film.

The invention can provide a method for manufacturing a piezoelectric element according to one aspect of the invention.

(10) In a method for manufacturing a piezoelectric element according to one aspect of the invention, the resin layer may be formed of a photosensitive resin material.

The photosensitive resin material can be patterned by photoetching, allowing the piezoelectric element to be manufactured by a simpler method.

BRIEF DESCRIPTION OF THE DRAWINGS

The invention will be described with reference to the accompanying drawings, wherein like numbers reference like elements.

DESCRIPTION OF EXEMPLARY EMBODIMENTS

Preferred embodiments of the invention will be described in detail below with reference to the drawings. However, these embodiments should not be construed to unduly limit the invention defined by the claims. Furthermore, all the elements described below are not necessarily essential for the invention.

Figure 1:
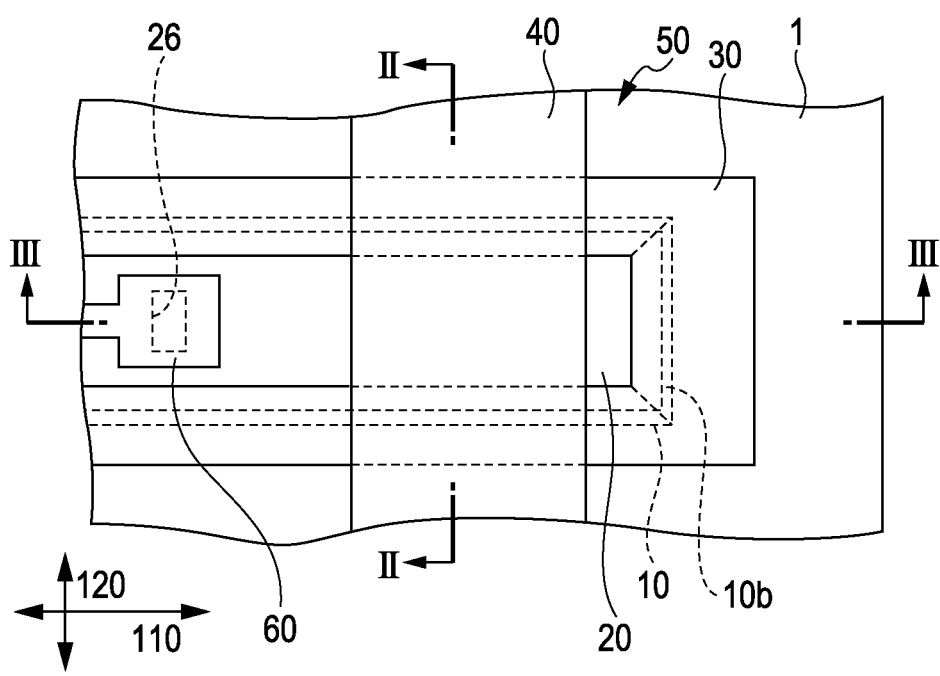
FIG. 1 is a schematic plan view of a piezoelectric element according to one embodiment of the invention.
Figure 2A:
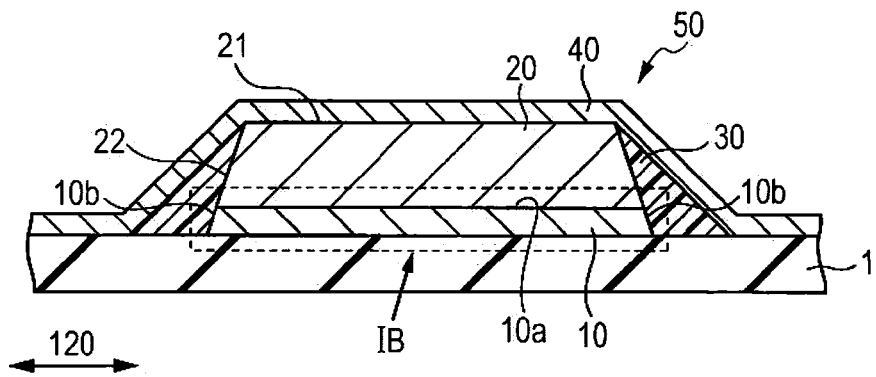
FIG. 2A is a cross-sectional view of the piezoelectric element taken along the line II-II in FIG. 1.
Figure 2B:
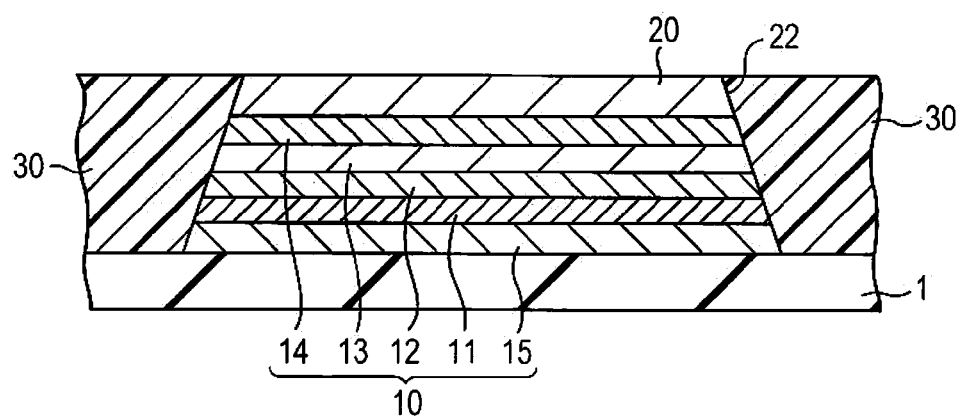
FIG. 2B is an enlarged view of a principal portion of the piezoelectric element illustrated in FIG. 2A.
Figure 3:
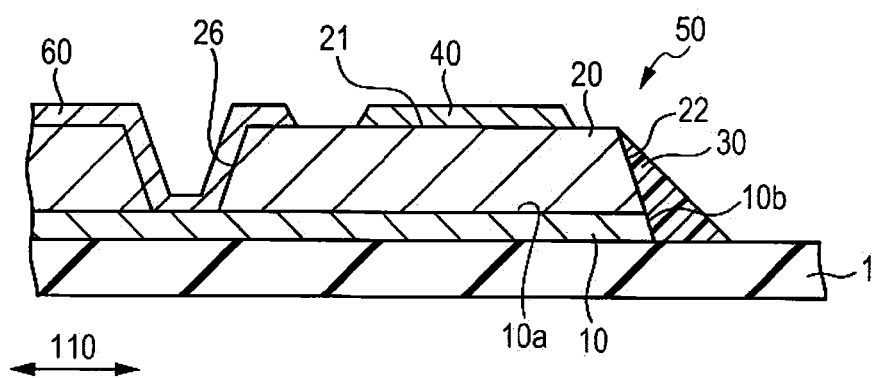
FIG. 3 is a cross-sectional view of the piezoelectric element taken along the line III-III in FIG. 1.

1. Piezoelectric Element and Piezoelectric Actuator 1-1. Structure of Piezoelectric Element and Piezoelectric Actuator FIG. 1 is a schematic plan view of a piezoelectric element 50 according to the present embodiment. FIG. 2A is a cross-sectional view of the piezoelectric element 50 taken along the line II-II in FIG. 1. FIG. 2B is an enlarged view of a principal portion IB of the piezoelectric element 50 illustrated in FIG. 2A. FIG. 3 is a cross-sectional view of the piezoelectric element 50 taken along the line III-III in FIG. 1.

As illustrated in FIG. 1, the piezoelectric element 50 according to the present embodiment includes a first electrode 10, a piezoelectric layer 20, a resin layer 30, and a second electrode 40.

The piezoelectric element 50 is formed on a substrate 1. As illustrated in FIG. 1, the piezoelectric element 50 may extend in one direction. This direction is hereinafter referred to as a first direction 110. A direction crossing the first direction is hereinafter referred to as a second direction 120. The first direction 110 may be substantially perpendicular to the second direction 120.

The substrate 1 may be a flat plate formed of an electric conductor, a semiconductor, or an insulator. The substrate 1 may have a monolayer or multilayer structure. The substrate 1 may have any internal structure provided that the substrate 1 has a flat top surface. For example, the substrate 1 may have an internal space.

In the case that the substrate 1 is a diaphragm of a piezoelectric actuator including the piezoelectric element 50, the substrate 1 produces mechanical output in the operation of the piezoelectric element 50. The substrate 1 may serve as a movable portion of a piezoelectric actuator including the piezoelectric element 50 and constitute part of the walls of a pressure-generating chamber. The substrate 1 has an appropriate thickness depending on the elastic modulus of the material used. In the case that the substrate 1 is a diaphragm of a piezoelectric actuator including the piezoelectric element 50, the substrate 1 has a thickness in the range of 200 to 2000 nm, for example. It may be difficult to produce mechanical output, such as vibrations, from a substrate having a thickness below 200 nm. On the other hand, a substrate having a thickness above 2000 nm may produce no vibration. The operation of the piezoelectric layer 20 can bend or vibrate the substrate 1.

In the case that the substrate 1 is a diaphragm of a piezoelectric actuator including the piezoelectric element 50, it is desirable that the substrate 1 contain a rigid material having a high mechanical strength. Examples of the material of the substrate 1 include, but are not limited to, inorganic oxides, such as zirconium oxide and silicon oxide, silicon nitride, and alloys, such as stainless steel. Among these, the material of the substrate 1 is preferably zirconium oxide because of its high chemical stability and rigidity. The substrate 1 may have a layered structure composed of at least two substances described above.

As illustrated in FIGS. 1, 2A, and 3, the first electrode 10 is formed on the substrate 1. As illustrated in FIGS. 1 and 3, the first electrode 10 may extend in the first direction 110. As illustrated in FIG. 2A, the first electrode 10 has a top surface 10a opposite to the substrate 1 and side surfaces 10b between the top surface 10a and the substrate 1. As illustrated in FIGS. 2A and 3, the side surfaces 10b may taper down toward the top.

The first electrode 10 forms a pair with the second electrode 40 and functions as one of two electrodes disposed on opposite sides of the piezoelectric layer 20. The first electrode 10 may be a lower electrode of the piezoelectric element 50. As illustrated in FIGS. 1 and 3, the first electrode 10 is electrically connected to a lead wire 60, which is electrically connected to a drive circuit (not shown). The first electrode 10 may be electrically connected to the lead wire 60 by any method. For example, the first electrode 10 may be electrically connected to the lead wire 60 through a contact hole 26 in the piezoelectric layer 20 described below.

The first electrode 10 of the piezoelectric element 50 according to the present embodiment is composed of a plurality of electroconductive layers, as described in detail below.

As illustrated in FIG. 2B, the first electrode 10 includes a metal layer 11 and an anti-oxidation layer 12. The first electrode 10 may further include a first adhesion layer 13, an orientation control layer 14, and a second adhesion layer 15.

The metal layer 11 may have a layer or thin-film shape. The metal layer 11 may be formed on the second adhesion layer 15 described below. Although not shown, the metal layer 11 may be formed on the substrate 1. The metal layer 11 functions as an electroconductive layer in the first electrode 10. The metal layer 11 may be formed of a base metal. The material of the metal layer 11 may be a metal that is more easily oxidized in the air than noble metals and that has a greater ionization tendency than noble metals. For example, the material of the metal layer 11 may contain at least one selected from metals having a melting point equal to or more than the firing temperature of the piezoelectric layer 20 (for example, 800° C.) and a high electrical conductivity (for example, a resistivity of 60 μΩ cm or less). More specifically, examples of the material of the metal layer 11 include, but are not limited to, metals and alloys each containing at least one selected from the group consisting of W, Ta, Hf, Mo, Nb, Zr, Cu, Ni, Co, Fe, Cr, V, and Ti. The metal layer 11 may contain noble metals, such as Pt, Ir, and Pd.

The anti-oxidation layer 12 is disposed between the metal layer 11 and the piezoelectric layer 20 to prevent contact between the metal layer 11 and the piezoelectric layer 20. More specifically, the anti-oxidation layer 12 covers the surface (top surface) of the metal layer 11 opposite to the substrate 1. The anti-oxidation layer 12 has the function of preventing the oxidation of the metal layer 11. The anti-oxidation layer 12 may have electrical conductivity and function as an electroconductive layer in the first electrode 10. The anti-oxidation layer 12 may be formed of an electroconductive nitride film. More specifically, examples of the material of the anti-oxidation layer 12 include, but are not limited to, TiN, CrN, NbN, TaN, ZrN, TiAlN, TiCrN, TiZrN, TiHfN, TiNbN, and AlCrN. The electroconductivity can reduce the effects of the anti-oxidation layer 12 on the total resistance of the first electrode 10.

The first adhesion layer 13 may be formed on the anti-oxidation layer 12. As illustrated in FIG. 2B, the first adhesion layer 13 is disposed between the anti-oxidation layer 12 and the orientation control layer 14 described below. The first adhesion layer 13 has the function of improving the adhesion between the anti-oxidation layer 12 and the orientation control layer 14. Examples of the material of the first adhesion layer 13 include, but are not limited to, metals and alloys each containing at least one selected from the group consisting of Ti, Cr, Ni, Ta, Zr, and W.

The orientation control layer 14 is disposed between the first adhesion layer 13 and the piezoelectric layer 20. The orientation control layer 14 has the function of adjusting the crystalline orientation of the piezoelectric layer 20 to a desired orientation. The material of the orientation control layer 14 may be an electroconductive perovskite oxide. More specifically, examples of the material of the orientation control layer 14 include, but are not limited to, lanthanum-nickel oxides, such as $LaNiO_3$, $La_2NiO_4$, $La_3Ni_2O_7$, $La_4Ni_3O_{10}$, and $La_3Ni_2O_6$, and $ReO_3$, $SrReO_3$, $BaReO_3$, $LaTiO_3$, $LaAlO_3$, $SrVO_3$, $CaCrO_3$, $SrCr_3$, $SrFeO_3$, $La_{1-x}SrCoO_3$ (0<X<0.5), $CaRuO_3$, $SrRuO_3$, $SrTiO_3$, and $BaPbO_3$.

As illustrated in FIG. 2B, the second adhesion layer 15 may be formed between the metal layer 11 and the substrate 1. The second adhesion layer 15 has the function of improving the adhesion between the substrate 1 and the metal layer 11. Examples of the material of the second adhesion layer 15 include, but are not limited to, metals and alloys each containing at least one selected from the 8group consisting of Ti, Cr, Ni, Ta, Zr, and W.

As illustrated in FIGS. 1, 2A, and 3, the piezoelectric layer 20 is disposed between the first electrode 10 and the second electrode 40. As illustrated in FIGS. 1, 2A, and 3, the piezoelectric layer 20 is formed on the top surface 10a of the first electrode 10. As illustrated in FIG. 3A, the piezoelectric layer 20 extends in the first direction 110 like the first electrode 10. As illustrated in FIG. 2A, the piezoelectric layer 20 has a top surface 21 on which the second electrode 40 described below is to be formed (a surface opposite to the first electrode 10) and tapered side surfaces 22. The side surfaces 22 are continuous with the tapered side surfaces 10b of the first electrode 10. The piezoelectric layer 20 may have any thickness provided that the piezoelectric layer 20 can substantially expand and contract upon the application of a voltage.

The material of the piezoelectric layer 20 is preferably a perovskite oxide having a general formula of $ABO_3$. Specific examples of the material of the piezoelectric layer 20 include, but are not limited to, lead zirconate titanate (PZT) ($Pb(Zr,Ti)O_3$), lead zirconate titanate niobate (PZTN) ($Pb(Zr,Ti,Nb)O_3$), barium titanate ($BaTiO_3$), and potassium sodium niobate (($K,Na)NbO_3$).

As illustrated in FIGS. 2A and 3, the piezoelectric layer 20 may be formed of a piezoelectric substance crystallized on the top surface of the first electrode 10. Thus, the piezoelectric layer 20 is formed on the flat surface having substantially no edge or step and can be stably formed on the orientation control layer 14. The piezoelectric layer 20 therefore has high reliability.

As illustrated in FIGS. 1, 2A, and 3, the resin layer 30 covers at least the side surfaces 10b of the first electrode 10. The resin layer 30 may have any shape provided that the first electrode 10 is insulated from the second electrode 40. As illustrated in FIG. 2A, the resin layer 30 may continuously cover the side surfaces 10b of the first electrode 10 and the side surfaces 22 of the piezoelectric layer 20. The coverage of the side surfaces 22 of the piezoelectric layer 20 with the resin layer 30 can reduce the effects of atmospheric water on the piezoelectric layer 20, thereby improving the reliability of the piezoelectric element 50. Although not shown, the resin layer 30 may cover the side surfaces 10b of the first electrode 10 and part of the side surfaces 22 of the piezoelectric layer 20.

The material of the resin layer 30 may be any insulating material and may be formed of a known resin material. The known resin material may be a known photosensitive resin material. The photosensitive resin material may be any resin having photosensitivity. The photosensitive resin material may be a polymer that is a precursor composition of a known photosensitive resin material. More specifically, the photosensitive resin material may be a photoresist or a photosensitive resin composition, such as a known photosensitive polyimide or poly(vinyl alcohol) derivative. The photosensitive resin material may also be a photosensitive resin composition that contains a known polymerizable compound having an unsaturated bond and a photopolymerization initiator.

The term "photosensitive" in a photosensitive material means that selective exposure of a particular region of the material to an energy beam, such as a radiation, and subsequent development using a developer can selectively remove the particular region. The photosensitive material may be a positive resist in which a region exposed to an energy beam, such as a radiation, can be selectively removed with a developer or a negative resist in which an unexposed region can be selectively removed with a developer.

The second electrode 40 is disposed on the piezoelectric layer 20 opposite to the first electrode 10. In FIGS. 1, 2A, and 3, the second electrode 40 is disposed on the piezoelectric layer 20 and the resin layer 30. The second electrode 40 may be formed in any region provided that the region is disposed on the piezoelectric layer 20, overlaps with at least part of the first electrode 10, and forms a drive region (a practically deformable region of the piezoelectric layer 20 between the first electrode 10 and the second electrode 40). The detailed shape of the second electrode 40 is a design factor in the determination of the drive region and can be appropriately determined in accordance with a desired drive region.

The second electrode 40 forms a pair with the first electrode 10 and functions as one of two electrodes disposed on opposite sides of the piezoelectric layer 20. In the case that the first electrode 10 is a lower electrode, the second electrode 40 may be an upper electrode. The second electrode 40 may extend in the second direction 120 and function as an upper electrode of another piezoelectric element 50 (not shown). In other words, the second electrode 40 may be a common electrode. The second electrode 40 is electrically connected to a drive circuit (not shown). The second electrode 40 may be electrically connected to the drive circuit by any method. For example, the second electrode 40 may be electrically connected to the drive circuit through a lead wire (not shown).

The material of the second electrode 40 may be any electroconductive substance. Examples of the material of the second electrode 40 include, but are not limited to, various metals, such as Ni, Ir, Au, Pt, W, Ti, Ta, Mo, and Cr, alloys of these metals, electroconductive oxides of these metals (such as iridium oxide), complex oxides of Sr and Ru, and complex oxides of La and Ni. The second electrode 40 may have a monolayer or multilayer structure composed of the material(s) described above.

The piezoelectric element 50 according to the present embodiment may have any of the structures described above. In the piezoelectric element 50 according to the present embodiment, a structure including the substrate 1 as a diaphragm provides a piezoelectric actuator 100 including the piezoelectric element 50. This can provide a piezoelectric actuator including a piezoelectric element that can have a high degree of freedom with respect to the selection of the electrode material.

The piezoelectric element according to the present embodiment has the following advantages, for example.

The piezoelectric element according to the present embodiment has a structure in which the metal layer 11 of the first electrode 10 is protected from oxidation by the formation of the anti-oxidation layer 12 between the metal layer 11 of the first electrode 10 and the piezoelectric layer 20 to prevent contact between the metal layer 11 and the piezoelectric layer 20 and the formation of the resin layer 30 to cover the side surfaces 10b of the first electrode 10. This can reduce the effects of oxidation and allows the use of a base metal, which is more easily oxidized than noble metals, as the material of the metal layer 11 of the first electrode 10.

Thus, there is provided the piezoelectric element 50 that can have a high degree of freedom with respect to the selection of the material for the metal layer of the first electrode and allows the use of a base metal in the first electrode. There is also provided the piezoelectric actuator 100 that includes the piezoelectric element 50.

Figure 4:
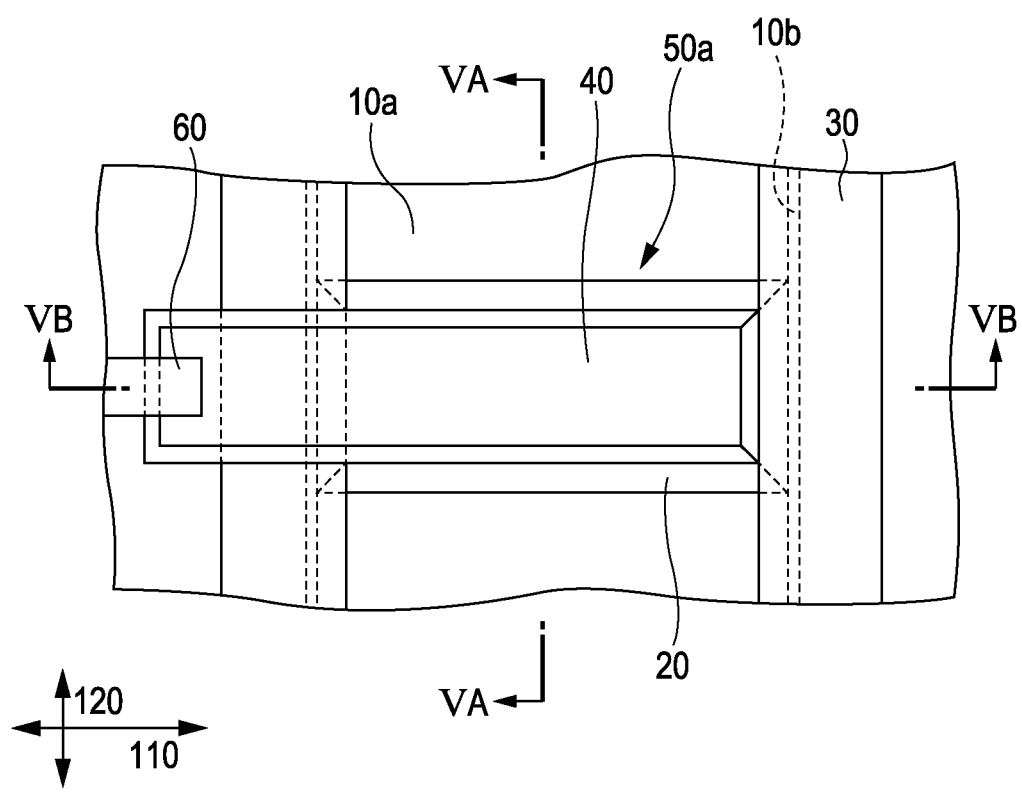
FIG. 4 is a schematic plan view of a piezoelectric element according to a modified embodiment.
Figure 5A:
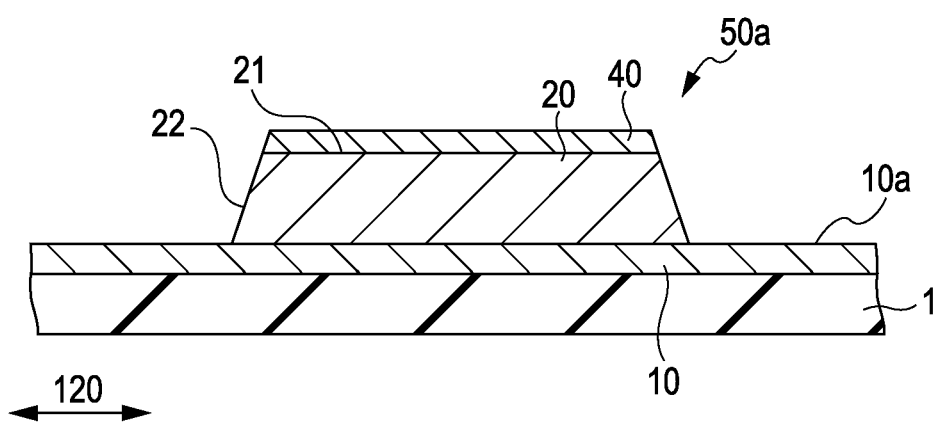
FIG. 5A is a cross-sectional view of the piezoelectric element taken along the line VA-VA in FIG. 4.
Figure 5B:
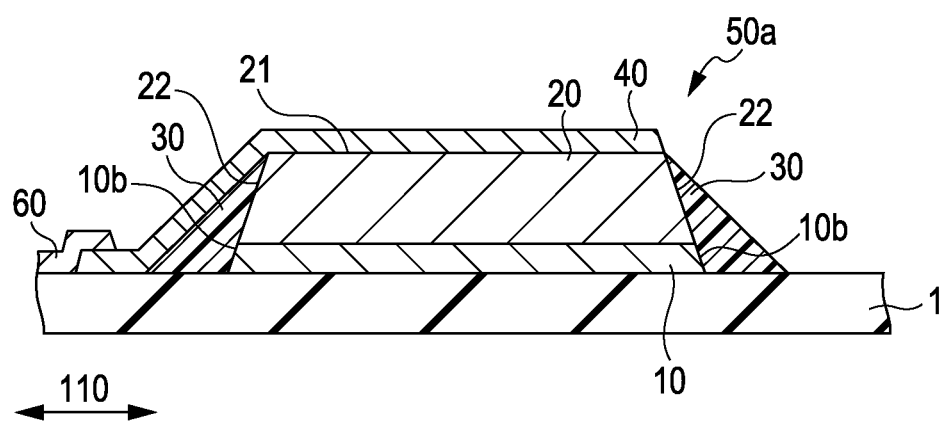
FIG. 5B is a cross-sectional view of the piezoelectric element taken along the line VB-VB in FIG. 4.

1-2. Modified Embodiments of Structures of Piezoelectric Element and Piezoelectric Actuator FIG. 4 is a schematic plan view of a piezoelectric element 50a according to a modified embodiment. FIG. 5A is a cross-sectional view of the piezoelectric element 50a taken along the line VA-VA in FIG. 4. FIG. 5B is a cross-sectional view of the piezoelectric element 50a taken along the line VB-VB in FIG. 4. The following description relates only to a structure different from the structure of the piezoelectric element 50 described above with reference to FIGS. 1 to 3. The material and the principal function of each component are substantially the same as the piezoelectric element 50 described above with reference to FIGS. 1 to 3.

As illustrated in FIGS. 4, 5A, and 5B, a first electrode 10 according to the present modified embodiment does not extend in the first direction 110 but extends in the second direction 120. As illustrated in FIG. 5B, the first electrode 10 has side surfaces 10b continuous with side surfaces 22 of a piezoelectric layer 20 only in the first direction 110. The first electrode 10 may extend in the second direction 120 and function as a lower electrode of another piezoelectric element 50 (not shown). In other words, the first electrode 10 may be a common electrode.

The side surfaces 22 of the piezoelectric layer 20 in the second direction 120 are not continuous with the side surfaces 10b of the first electrode 10 and come into contact with a top surface 10a.

As illustrated in FIGS. 4 and 5B, a resin layer 30 in the first direction 110 covers at least the side surfaces 10b of the first electrode 10. Although not shown, the resin layer 30 may cover the side surfaces 22 of the piezoelectric layer 20 in the second direction 120 and an exposed portion of the top surface 10a of the first electrode 10. The resin layer 30 may cover side surfaces 10b (not shown) of the first electrode 10 in the second direction 120.

As illustrated in FIGS. 4 and 5B, the second electrode 40 extends on a top surface 21 of the piezoelectric layer 20 in the first direction 110. The second electrode 40 may be formed in any region provided that the region is disposed on the piezoelectric layer 20, overlaps with at least part of the first electrode 10, and forms a drive region. The detailed shape of the second electrode 40 is a design factor in the determination of the drive region and is appropriately determined in accordance with a desired drive region. As illustrated in FIG. 4, the second electrode 40 may entirely or partially cover the top surface 21 of the piezoelectric layer 20.

The piezoelectric element according to the present modified embodiment can have the advantages of the piezoelectric element 50 described above.

1-3. Method for Manufacturing Piezoelectric Element

A method for manufacturing the piezoelectric element 50 according to the present embodiment will be described below. FIGS. 6A to 6D and FIGS. 7A to 7D are schematic cross-sectional views illustrating processes for manufacturing the piezoelectric element 50 according to the present embodiment.

A method for manufacturing a piezoelectric element according to the present embodiment includes forming a first electroconductive film 10c on a substrate 1, forming a piezoelectric material film 20a on the first electroconductive film 10c, heat-treating the piezoelectric material film 20a to form a piezoelectric film 20b, patterning the first electroconductive film 10c and the piezoelectric film 20b to form a first electrode 10 and a piezoelectric layer 20, forming a resin layer 30 to cover at least the side surfaces of the first electrode 10, and forming a second electrode 40 on the piezoelectric layer 20.

Figure 6A:
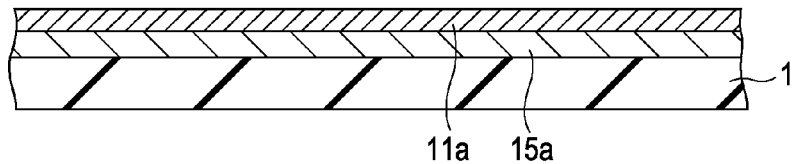
FIG. 6A is a schematic cross-sectional view illustrating a process for manufacturing a piezoelectric element according to one embodiment of the invention.

First, as illustrated in FIG. 6A, a second adhesion film 15a may be formed on the substrate 1 by any method, including a known film-forming method, for example, vapor deposition, such as chemical vapor deposition (CVD) or physical vapor deposition (PVD), plating, sputtering, metal-organic deposition (MOD), or spin coating.

As illustrated in FIG. 6A, a metal film 11a is then formed on the second adhesion film 15a by any method, including a known film-forming method, for example, vapor deposition, such as CVD or PVD, plating, sputtering, MOD, or spin coating.

Figure 6B:
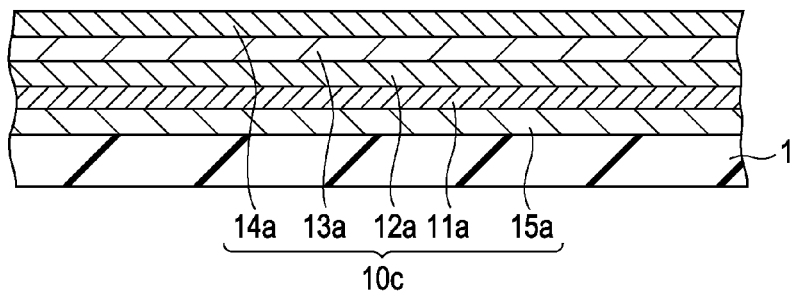
FIG. 6B is a schematic cross-sectional view illustrating a process for manufacturing a piezoelectric element according to one embodiment of the invention.

As illustrated in FIG. 6B, an anti-oxidation film 12a is formed on the metal film 11a. The anti-oxidation film 12a is formed between the metal film 11a and the piezoelectric material film 20a to prevent contact between the metal film 11a and the piezoelectric material film 20a. The anti-oxidation film 12a may be formed by any method, including a known film-forming method, for example, vapor deposition, such as CVD or PVD, plating, sputtering, MOD, or spin coating.

A first adhesion film 13a may subsequently be formed on the substrate 1 by any method, including a known film-forming method, for example, vapor deposition, such as chemical vapor deposition (CVD) or physical vapor deposition (PVD), plating, sputtering, metal-organic deposition (MOD), or spin coating.

An orientation control film 14a may be formed on the first adhesion film 13a by any method, including a known film-forming method, for example, vapor deposition, such as CVD or PVD, plating, sputtering, MOD, or spin coating.

The first electroconductive film 10c thus formed is composed of the second adhesion film 15a, the metal film 11a, the anti-oxidation film 12a, the first adhesion film 13a, and the orientation control film 14a.

Figure 6C:
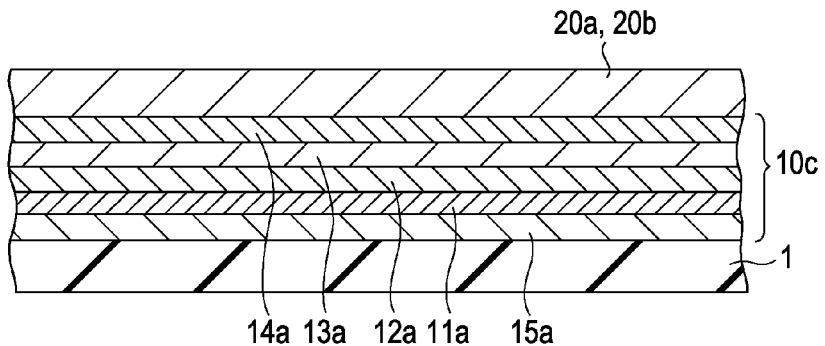
FIG. 6C is a schematic cross-sectional view illustrating a process for manufacturing a piezoelectric element according to one embodiment of the invention.

As illustrated in FIG. 6C, a piezoelectric material film 20a is then formed on the first electroconductive film 10c by any method, including a known film-forming method, for example, a sol-gel method, spin coating, CVD, MOD, sputtering, or laser ablation.

The piezoelectric material film 20a may be heat-treated to be crystallized, forming a piezoelectric film 20b. The conditions for heat treatment are not particularly limited provided that the piezoelectric material film 20a can be crystallized.

For example, the piezoelectric material film 20a may be heat-treated in an oxygen atmosphere at a temperature in the range of 500° C. to 800° C.

The anti-oxidation film 12a covering the metal film 11a of the first electroconductive film 10c can prevent the oxidization of the metal film 11a during the heat-treatment of the piezoelectric material film 20a. Furthermore, in the presence of the orientation control film 14a, the piezoelectric material film 20a can be crystallized on the flat orientation control film 14a having substantially no asperities. The orientation control film 14a can control the orientation of the piezoelectric film 20b with higher precision. Thus, a reliable piezoelectric layer can be formed.

The first electroconductive film 10c and the piezoelectric film 20b are patterned into the first electrode 10 and the piezoelectric layer 20, for example, by a known photolithography technique and a known etching technique. The etching may be wet etching or dry etching.

Figure 6D:
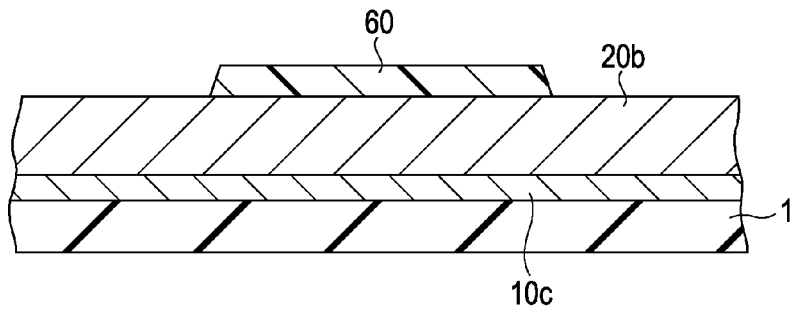
FIG. 6D is a schematic cross-sectional view illustrating a process for manufacturing a piezoelectric element according to one embodiment of the invention.

For example, as illustrated in FIG. 6D, after a resist 60 is applied to the piezoelectric film 20b, the first electroconductive film 10c and the piezoelectric film 20b are etched to form the piezoelectric layer 20 having a desired shape. Furthermore, although not shown, the material of the second electrode 40 may be used to form a mask layer having a desired pattern as an etching hard mask by a known film-forming method.

Figure 7A:
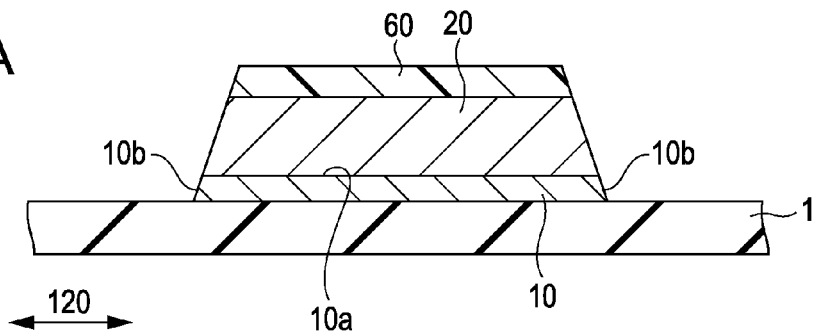
FIG. 7A is a schematic cross-sectional view illustrating a process for manufacturing a piezoelectric element according to one embodiment of the invention.
Figure 7B:
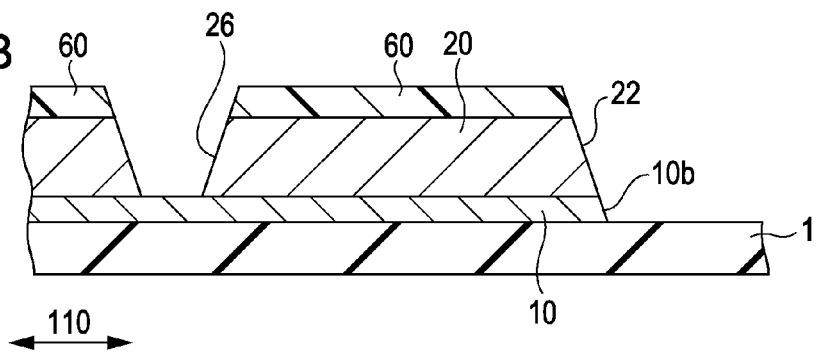
FIG. 7B is a schematic cross-sectional view illustrating a process for manufacturing a piezoelectric element according to one embodiment of the invention.

As illustrated in FIGS. 7A and 7B, the first electroconductive film 10c and the piezoelectric film 20b are then patterned into the first electrode 10 and the piezoelectric layer 20. As illustrated in FIG. 7A, the first electroconductive film 10c and the piezoelectric film 20b may be etched using the resist 60 to form the first electrode 10 and the piezoelectric layer 20 each having a desired shape.

As illustrated in FIG. 7B, the first electroconductive film 10c and the piezoelectric film 20b may be etched in a stepwise manner by the stepwise formation of a resist or the control of the etch rate to form a contact hole 26. Also in the formation of the first electrode 10 and the piezoelectric layer 20 of the piezoelectric element 50a according to the modified embodiment illustrated in FIGS. 4, 5A, and 5B, the first electrode 10 and the piezoelectric layer 20 each having a desired shape may be formed by stepwise etching.

If necessary, the resist 60 used in patterning can be removed after the formation of the first electrode 10 and the piezoelectric layer 20.

Figure 7C:
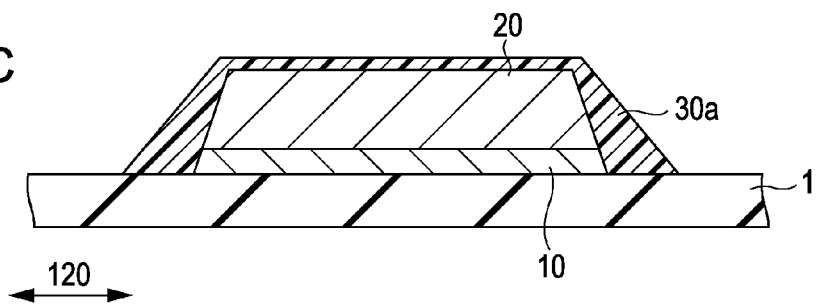
FIG. 7C is a schematic cross-sectional view illustrating a process for manufacturing a piezoelectric element according to one embodiment of the invention.

As illustrated in FIG. 7C, a resin material film 30a is formed by any method, including a known film-forming method. For example, the resin material film 30a can be conveniently formed by spin coating, in which the film thickness is larger on the side surfaces 22 than on the top surface 21 of the piezoelectric layer 20, as illustrated in FIG. 7C.

Figure 7D:
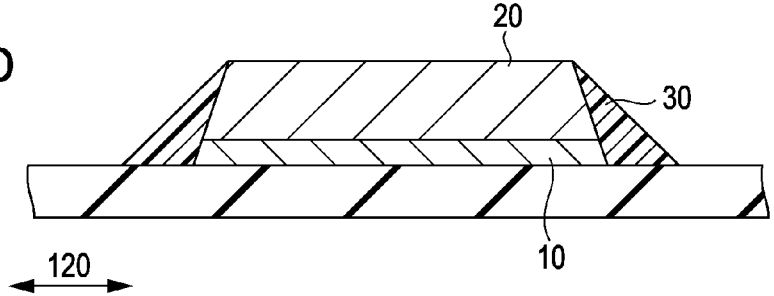
FIG. 7D is a schematic cross-sectional view illustrating a process for manufacturing a piezoelectric element according to one embodiment of the invention.

As illustrated in FIG. 7D, the resin material film 30a is then patterned in a desired shape, for example, by a known photolithography technique and a known etching technique. For example, the resin layer 30 having a desired shape may be formed using a resist (not shown). The resin layer 30 may have any shape provided that the resin layer 30 covers at least the side surfaces of the first electrode 10 and does not cover a region on the piezoelectric layer 20 in which the second electrode 40 is to be formed. A resin material film 30a formed of a photosensitive resin material can be easily patterned by a photolithography technique.

A second electroconductive film (not shown) is then formed on the piezoelectric layer 20 and is patterned into the second electrode 40 (see FIGS. 2A and 3). The second electroconductive film may be formed by a known film-forming method, for example, vapor deposition, such as CVD or PVD, plating, sputtering, MOD, or spin coating. The second electroconductive film is patterned, for example, by a known photolithography technique and a known etching technique.

Although not shown, a second electroconductive film formed in the contact hole 26 may be used to form a lead wire 60 (see FIG. 3). Although not shown, a second electroconductive film formed in the contact hole 26 may be connected to another lead wire. In this case, use of a wiring material having a lower resistance than the second electroconductive film can reduce the voltage drop caused by lead wiring.

Through these processes, the piezoelectric element 50 and the piezoelectric actuator 100 can be manufactured. Although the piezoelectric element 50 according to the present embodiment was mainly described, the piezoelectric element 50a according to the modified embodiment can also be manufactured in the same way.

The method for manufacturing the piezoelectric element 50 and the piezoelectric actuator 100 according to the present embodiment has the following advantages, for example.

The piezoelectric element 50 and the piezoelectric actuator 100 according to the present embodiment can be manufactured by the method for manufacturing the piezoelectric element 50 and the piezoelectric actuator 100 according to the present embodiment.

2. Droplet-Ejecting Head

Figure 8:
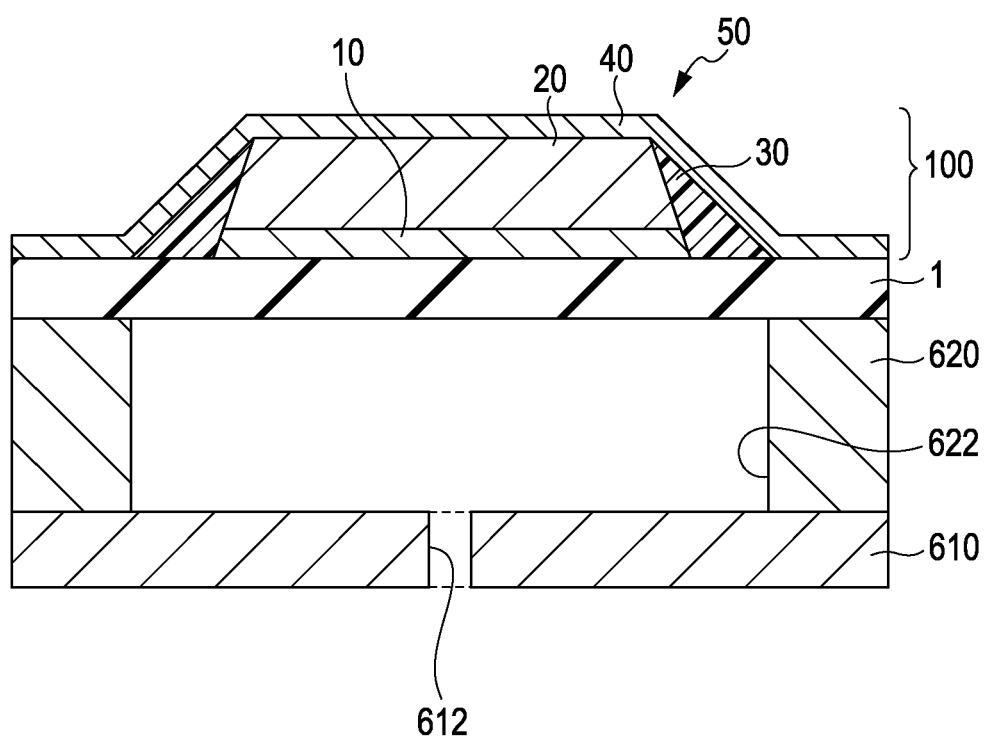
FIG. 8 is a schematic cross-sectional view of a principal portion of a droplet-ejecting head according to one embodiment of the invention.
Figure 9:
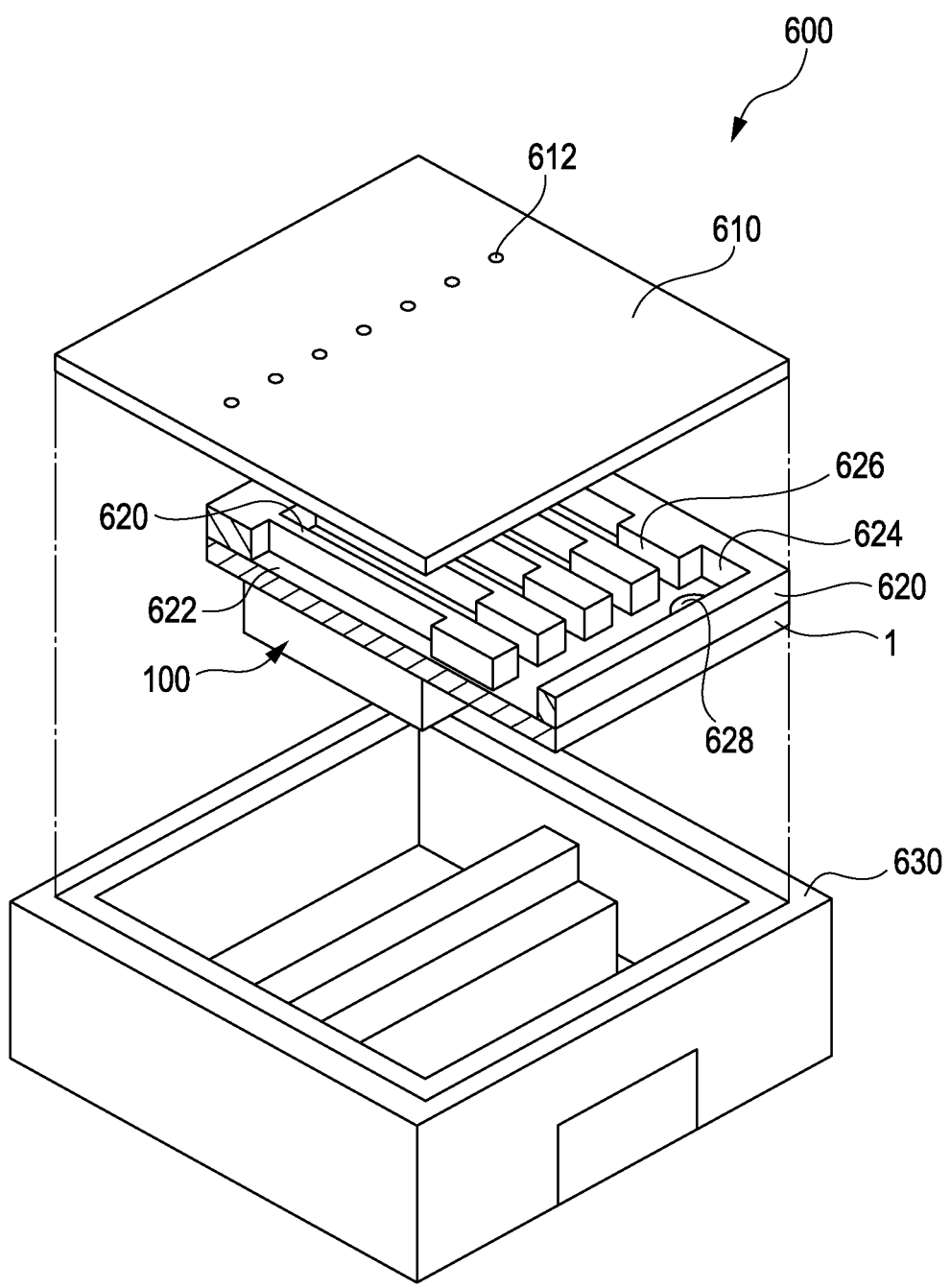
FIG. 9 is an exploded perspective view of a droplet-ejecting head according to one embodiment of the invention.

A droplet-ejecting head 600 in which the piezoelectric element 50 according to the present embodiment functions as a piezoelectric actuator will be described below with reference to the drawings. FIG. 8 is a schematic cross-sectional view of a principal portion of a droplet-ejecting head 600 according to the present embodiment. FIG. 9 is an exploded perspective view of the droplet-ejecting head 600 according to the present embodiment. The droplet-ejecting head 600 is illustrated upside down.

The droplet-ejecting head 600 may include the piezoelectric element (piezoelectric actuator) described above. In this embodiment, the droplet-ejecting head 600 includes the substrate 1 as a diaphragm 1 and the piezoelectric element(s) 50 as a piezoelectric actuator(s).

As illustrated in FIGS. 8 and 9, the droplet-ejecting head 600 includes a nozzle plate 610 having nozzle orifices 612, a pressure chamber substrate 620 having pressure chambers 622, and the piezoelectric element(s) 50 (50a).

The number of the piezoelectric element(s) 50 is not particularly limited and may be plural. In the case that the droplet-ejecting head 600 includes a plurality of piezoelectric elements 50, the second electrode 40 serves as a common electrode. In the case that the droplet-ejecting head 600 includes a plurality of piezoelectric elements 50a, the first electrode 10 serves as a common electrode. As illustrated in FIG. 9, the droplet-ejecting head 600 may include a housing 630. In FIG. 9, the piezoelectric elements 50 are simplified.

As illustrated in FIGS. 8 and 9, the nozzle plate 610 has the nozzle orifices 612. Fluids (including not only liquids but also various functional materials adjusted with solvents or dispersion media to have appropriate viscosities or those containing metal flakes; the same applies hereinafter), such as inks, can be ejected as droplets from the nozzle orifices 612. For example, the nozzle plate 610 has a line of nozzle orifices 612. Examples of the material of the nozzle plate 610 include, but are not limited to, silicon and stainless steel (SUS).

The pressure chamber substrate 620 is disposed on the nozzle plate 610 (under the nozzle plate 610 in FIG. 9). Examples of the material of the pressure chamber substrate 620 include, but are not limited to, silicon. As illustrated in FIG. 9, the pressure chamber substrate 620 defines the space between the nozzle plate 610 and a diaphragm 10a, forming a reservoir (liquid storage) 624, supply ports 626 in communication with the reservoir 624, and the pressure chambers 622 in communication with the supply ports 626. The reservoir 624, the supply ports 626, and the pressure chambers 622, together constituting the flow passage of a fluid, are described separately in the present embodiment. However, such a flow passage may be designed freely. For example, although the supply ports 626 are narrow in FIG. 9, the supply ports 626 may be freely formed in accordance with the design and are not necessarily essential components. The reservoir 624, the supply ports 626, and the pressure chambers 622 are defined by the nozzle plate 610, the pressure chamber substrate 620, and the diaphragm 10a. The reservoir 624 can temporarily retain ink supplied from the outside (for example, an ink cartridge) via a through-hole 628 formed in the diaphragm 10a. Ink in the reservoir 624 can be supplied to the pressure chambers 622 through the supply ports 626. The deformation of the diaphragm 10a changes the volumes of the pressure chambers 622. Since the pressure chambers 622 communicate with the nozzle orifices 612, a change in the volumes of the pressure chambers 622 results in the ejection of a fluid from the nozzle orifices 612.

The piezoelectric element(s) 50 are disposed on the pressure chamber substrate 620 (under the pressure chamber substrate 620 in FIG. 9). The piezoelectric element(s) 50 are electrically connected to a piezoelectric element drive circuit (not shown) and can operate (vibrate or deform) in response to signals from the piezoelectric element drive circuit. The operation of the layered structure (the piezoelectric layer 20) can deform the diaphragm 10a and thereby change the internal pressure of the pressure chambers 622.

As illustrated in FIG. 9, the housing 630 can house the nozzle plate 610, the pressure chamber substrate 620, and the piezoelectric element(s) 50. Examples of the material of the housing 630 include, but are not limited to, resins and metals.

The droplet-ejecting head 600 includes the piezoelectric actuator that can have a high degree of freedom with respect to the selection of the electrode material. This can provide a droplet-ejecting head including a piezoelectric element that can have a high degree of freedom with respect to the selection of the electrode material.

Although the droplet-ejecting head 600 is an ink jet recording head in the present embodiment, a droplet-ejecting head according to an embodiment of the invention can be used as a coloring material ejecting head for use in the manufacture of color filters for liquid crystal displays, an electrode material ejecting head for use in the formation of electrodes for organic EL displays and field emission displays (FEDs), and a bioorganic compound ejecting head for use in the manufacture of biochips.

3. Droplet-Ejecting Apparatus

Figure 10:
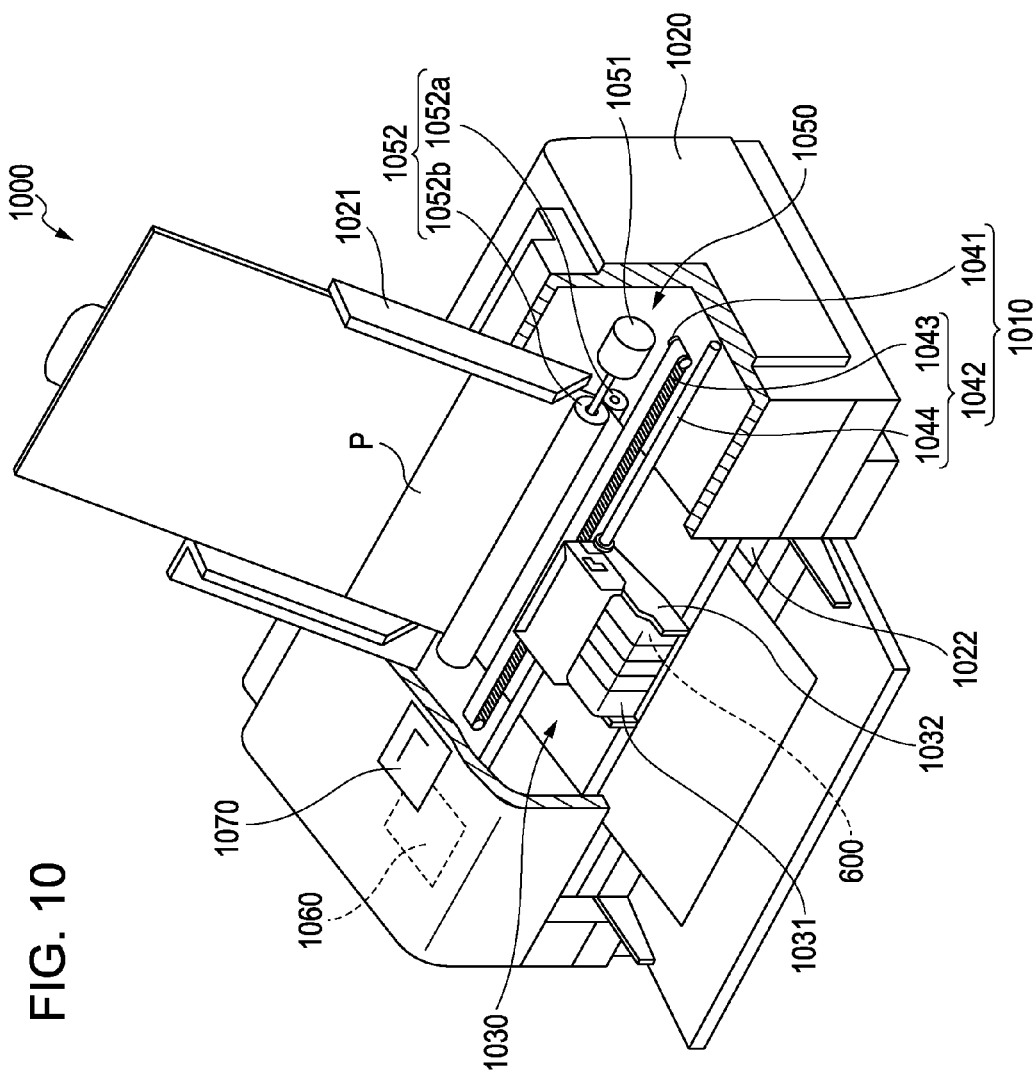
FIG. 10 is a schematic perspective view of a droplet-ejecting apparatus according to one embodiment of the invention.

A droplet-ejecting apparatus according to the present embodiment will be described below with reference to the drawings. The droplet-ejecting apparatus includes the droplet-ejecting head described above. In the following description, the droplet-ejecting apparatus is an ink jet printer that includes the droplet-ejecting head described above. FIG. 10 is a schematic perspective view of a droplet-ejecting apparatus 1000 according to the present embodiment.

The droplet-ejecting apparatus 1000 includes a head unit 1030, a drive unit 1010, and a control unit 1060. The droplet-ejecting apparatus 1000 may also include a main body 1020, a paper feeder 1050, a tray 1021 for recording paper sheets P, an outlet 1022 from which a recording paper sheet P is ejected, and an operation panel 1070 disposed on the top surface of the main body 1020.

The head unit 1030 includes an ink jet recording head (hereinafter also simply referred to as "head"), which is the droplet-ejecting head 600 described above. The head unit 1030 also includes an ink cartridge 1031, from which ink is supplied to the head, and a carriage 1032, on which the head and the ink cartridge 1031 are mounted.

The drive unit 1010 can move the head unit 1030 back and forth. The drive unit 1010 includes a carriage motor 1041 serving as a driving source for the head unit 1030 and a reciprocating mechanism 1042 for moving the head unit 1030 back and forth in response to the rotation of the carriage motor 1041.

The reciprocating mechanism 1042 includes a carriage guide rod 1044 supported by a frame (not shown) at both ends and a timing belt 1043 extending along the carriage guide rod 1044. The carriage guide rod 1044 supports the carriage 1032 such that the carriage 1032 can move back and forth freely. The carriage 1032 is fixed to a portion of the timing belt 1043. When the operation of the carriage motor 1041 drives the timing belt 1043, the head unit 1030 moves back and forth along the carriage guide rod 1044. During this reciprocating movement, ink is ejected from the head, producing a printed record on a recording paper sheet P.

In the present embodiment, both the droplet-ejecting head 600 and a recording paper sheet P move while printing is in progress. In a droplet-ejecting apparatus according to another embodiment of the invention, however, a droplet-ejecting head 600 and a recording paper sheet P may change their positions relative to each other while printing is in progress. Although the present embodiment describes printing on a recording paper sheet P, recording media used with a droplet-ejecting apparatus according to an embodiment of the invention are not limited to paper and may be a wide variety of media, such as cloth, films, and metals.

The control unit 1060 can control the head unit 1030, the drive unit 1010, and the paper feeder 1050.

The paper feeder 1050 can transport a recording paper sheet P from the tray 1021 to the head unit 1030. The paper feeder 1050 includes a paper feed motor 1051, which serves as a driving source, and feed rollers 1052, which rotate through the operation of the paper feed motor 1051. The feed rollers 1052 include a driven roller 1052a and a driving roller 1052b, which are disposed on opposite sides of the transport path of the recording paper sheet P. The driving roller 1052b is coupled to the paper feed motor 1051. The control unit 1060 orders the paper feeder 1050 to transport a recording paper sheet P under the head unit 1030.

The head unit 1030, the drive unit 1010, the control unit 1060, and the paper feeder 1050 are disposed within the main body 1020.

The droplet-ejecting apparatus 1000 includes the droplet-ejecting head that can have a high degree of freedom with respect to the selection of the electrode material. This can provide a droplet-ejecting apparatus including a piezoelectric element that can have a high degree of freedom with respect to the selection of the electrode material.

The droplet-ejecting apparatus described above includes one droplet-ejecting head for printing on a recording medium. A droplet-ejecting apparatus according to another embodiment may include a plurality of droplet-ejecting heads. The plurality of droplet-ejecting heads may operate independently as described above or operate as a combined head. One example of the combined head is a line head, in which the nozzle orifices of each head are arranged at regular intervals.

While a droplet-ejecting apparatus is described above as an ink jet recording apparatus according to an embodiment of the invention, a droplet-ejecting apparatus according to an embodiment of the invention can also be used industrially. In such a case, liquids (liquid materials) to be ejected may be various functional materials adjusted with solvents or dispersion media to have appropriate viscosities. In addition to image recording apparatuses, such as a printer described above, a droplet-ejecting apparatus according to an embodiment of the invention can be suitably used as a coloring material ejecting apparatus for use in the manufacture of color filters for liquid crystal displays, a liquid material ejecting apparatus for use in the formation of electrodes and color filters for organic EL displays, field emission displays (FEDs), and electrophoresis displays, and a bioorganic material ejecting apparatus for use in the manufacture of biochips.

The embodiments and various modifications thereof are for the purpose of illustration only and are not intended to limit the invention. For example, the embodiments and various modifications thereof may be combined.

The invention is not limited to the embodiments described above, and various modifications may be made therein. For example, the invention includes substantially the same constitutions as those described in the embodiments (for example, constitutions having the same functions, methods, and results, and constitutions having the same objects and advantages). The invention also includes constitutions in which unessential portions of the constitutions described in the embodiments are substituted. The invention also includes other constitutions that have the operation and effect of the constitutions described in the embodiments and other constitutions with which the same objects can be achieved. The invention also includes constitutions in which the constitutions described in the embodiments are combined with known techniques.

What is claimed is:

1. A piezoelectric element comprising:
   a first electrode disposed on a substrate, the first electrode including first and second tapered side surfaces;
   a piezoelectric layer disposed on the first electrode, the piezoelectric layer including first and second tapered side surfaces;
   a second electrode disposed on the piezoelectric layer; and
   a resin layer that covers at least the first and second tapered side surfaces of the first electrode,
   wherein the first electrode includes a metal layer and an anti-oxidation layer, the metal layer being formed of a base metal, and
   the anti-oxidation layer is disposed between the metal layer and the piezoelectric layer to prevent contact between the metal layer and the piezoelectric layer,
   wherein the first and second tapered sides surfaces of the first electrode and the first and second tapered side surfaces of the piezoelectric connect to form a continuous tapered side surface, and
   wherein the resin layer includes a tapered first side that is configured to match up with the continuous tapered side surface, the resin layer having a second side that is slanted in the same direction as the second electrode in an area where the second electrode covers the resin layer, the resin layer having a third side that contacts with the surface of the substrate.

2. The piezoelectric element according to claim 1, wherein the material of the metal layer contains at least one selected from the group consisting of W, Ta, Hf, Mo, Nb, Zr, Cu, Ni, Co, Fe, Cr, V, and Ti.

3. The piezoelectric element according to claim 1, wherein the first electrode further includes an orientation control layer between the piezoelectric layer and the anti-oxidation layer.

4. The piezoelectric element according to claim 3, wherein the first electrode further includes a first adhesion layer between the metal layer and the orientation control layer.

5. A piezoelectric actuator comprising a piezoelectric element according to claim 1, wherein the substrate is a diaphragm.

6. The piezoelectric actuator according to claim 5, further comprising a second adhesion layer between the first electrode and the diaphragm.

7. A droplet-ejecting head comprising a piezoelectric actuator according to claim 5.

8. A droplet-ejecting apparatus comprising a droplet-ejecting head according to claim 7.

9. A piezoelectric element comprising:
  a first electrode disposed on a substrate, the first electrode including first and second tapered side surfaces;
  a piezoelectric layer disposed on the first electrode, the piezoelectric layer including first and second tapered side surfaces;
  a second electrode disposed on top of the piezoelectric layer; and
  a resin layer that continuously covers at least the side surfaces of the first electrode and a side surface of the piezoelectric layer while being at least partially covered by the second electrode,
  wherein the first electrode includes a metal layer and an anti-oxidation layer, the metal layer being formed of a base metal, and
  the anti-oxidation layer is disposed between the metal layer and the piezoelectric layer to prevent contact between the metal layer and the piezoelectric layer,
  wherein the first and second tapered sides surfaces of the first electrode and the first and second tapered side surfaces of the piezoelectric connect to form a continuous tapered side surface, and
  wherein the resin layer includes a tapered first side that is configured to match up with the continuous tapered side surface, the resin layer having a second side that is slanted in the same direction as the second electrode in an area where the second electrode at least partially covers the resin layer, the resin layer having a third side that contacts with the surface of the substrate.

* * * * *